(12) United States Patent
Hsu

(10) Patent No.: US 11,063,049 B2
(45) Date of Patent: Jul. 13, 2021

(54) SEMICONDUCTOR DEVICE WITH SELF-ALIGNING LANDING PAD AND METHOD OF MANUFACTURING THE SAME

(71) Applicant: NANYA TECHNOLOGY CORPORATION, New Taipei (TW)

(72) Inventor: Ping Hsu, New Taipei (TW)

(73) Assignee: NANYA TECHNOLOGY CORPORATION, New Taipei (TW)

( * ) Notice: Subject to any disclaimer, the term of this patent is extended or adjusted under 35 U.S.C. 154(b) by 180 days.

(21) Appl. No.: 16/421,024

(22) Filed: May 23, 2019

(65) Prior Publication Data
US 2020/0373305 A1 Nov. 26, 2020

(51) Int. Cl.
*H01L 27/108* (2006.01)

(52) U.S. Cl.
CPC .. *H01L 27/10855* (2013.01); *H01L 27/10814* (2013.01)

(58) Field of Classification Search
CPC .................... H01L 27/10814; H01L 27/10855
See application file for complete search history.

(56) References Cited

U.S. PATENT DOCUMENTS

| 6,174,782 | B1 | 1/2001 | Lee | |
|---|---|---|---|---|
| 6,261,897 | B1 * | 7/2001 | Fukase | H01L 27/10855 257/E21.649 |
| 6,777,735 | B2 | 8/2004 | Oh | |

OTHER PUBLICATIONS

Office Action dated Jan. 15, 2020 related to Taiwanese Application No. 108127044.

* cited by examiner

*Primary Examiner* — Mark V Prenty
(74) *Attorney, Agent, or Firm* — Muncy, Geissler, Olds & Lowe, P.C.

(57) ABSTRACT

A semiconductor memory device includes a substrate with a drain and a source; a gate structure, disposed on the substrate between the drain and the source; a first dielectric, disposed on the substrate, covering the gate structure; a second dielectric disposed on the first dielectric; a plug having a first part in the first dielectric and a second part in the second dielectric, wherein the first part is in contact with the source of the substrate; a storage node landing pad, covering the second part of the plug and covered by the second dielectric; a bit line disposed on the second dielectric and connected to the drain of the substrate; a third dielectric disposed on the bit line; and a storage node, disposed on the third dielectric, contacting the storage node landing pad through the second dielectric and the third dielectric.

9 Claims, 5 Drawing Sheets

SEMICONDUCTOR DEVICE WITH SELF-ALIGNING LANDING PAD AND METHOD OF MANUFACTURING THE SAME

TECHNICAL FIELD

The present disclosure relates to a semiconductor memory device and a method of manufacturing the same, and more particularly, to a semiconductor memory device with a self-aligning landing pad and a method of manufacturing the same.

DISCUSSION OF THE BACKGROUND

The capacitance of the storage node of a dynamic random access memory (DRAM) is crucial to its performance. Insufficient capacitance results in shorter refresh times and insufficient voltage difference when reading data. A capacitor over bit line (COB) configuration is therefore proposed to eliminate constraints on size and shape of the storage node. Disposing the storage node above the bit line instead of between layers means the storage node does not to be flat and can be designed in a three-dimensional configuration.

However, COB configurations raise the storage node above the bit line, thus requiring a storage node contact hole with a greater aspect ratio since the distance between the source of the substrate and the storage node is increased. As the scale of design rules for highly-integrated memory devices is reduced from approximately 1 mm level in the generation of 1 Mbit-grade DRAM devices to about a 0.15 mm level in the generation of 1 Gbit-grade DRAM devices, the problem of space efficiency becomes more crucial. A technique of using landing pads instead of performing the etching process of the storage contact hole is proposed as a remedy.

Still, the conventional method of forming the landing pads used by prior art requires complicated steps because of the complicated shape combining the landing pad and the inter-layer connection. Moreover, the conventional method requires photolithography with very high precision as the scale of the design rules is reduced. Even very tiny defects in the process may cause unwanted connection between the landing pads and sabotage the memory device.

This Discussion of the Background section is provided for background information only. The statements in this Discussion of the Background are not an admission that the subject matter disclosed in this section constitutes prior art to the present disclosure, and no part of this Discussion of the Background section may be used as an admission that any part of this application, including this Discussion of the Background section, constitutes prior art to the present disclosure.

SUMMARY

The present disclosure provides a semiconductor memory device, comprising: a substrate with a drain and a source; a gate structure, disposed on the substrate between the drain and the source; a first dielectric, disposed on the substrate, covering the gate structure; a second dielectric disposed on the first dielectric; a plug having a first part in the first dielectric and a second part in the second dielectric, wherein the first part is in contact with the source of the substrate; a storage node landing pad, covering the second part of the plug and covered by the second dielectric; a bit line disposed on the second dielectric and connected to the drain of the substrate; a third dielectric disposed on the bit line; and a storage node, disposed on the third dielectric, contacting the storage node landing pad through the second dielectric and the third dielectric.

In some embodiments, the plug comprises copper, tungsten, or aluminum.

In some embodiments, the plug comprises copper and the storage node landing pad comprises Cu3Ge.

In some embodiments, the storage node landing pad comprises copper, gold, silver or aluminum.

In some embodiments, the semiconductor memory device further comprises a bit line landing pad on the drain of the substrate, wherein the bit line connects to the drain of the substrate by contacting the bit line landing pad.

In some embodiments, the bit line comprises aluminum.

In some embodiments, the first dielectric, the second dielectric and the third dielectric comprise silicon dioxide.

In some embodiments, the first dielectric, the second dielectric, and the third dielectric comprise borophosphorous silicate glass.

In some embodiments, the gate structure further comprises a silicide, a polycrystalline silicon, a gate oxide, and a spacer.

The present disclosure further provides a method of manufacturing a semiconductor memory device, the method comprising the steps of: providing a substrate with a drain, a source and a gate structure disposed on the substrate between the drain and the source; forming a first dielectric covering the substrate and the gate structure; forming a plug in the first dielectric, with a first part contacting the source of the substrate; exposing a second part of the plug through the first dielectric; forming a storage node landing pad on the exposed second part of the plug; forming a second dielectric on the first dielectric, covering the storage node landing pad; forming a bit line connected to the substrate through the second dielectric and the first dielectric; forming a third dielectric on the bit line; and forming a storage node on the third dielectric, wherein the storage node contacts the storage node landing pad through the third dielectric and the second dielectric.

In some embodiments, the step of forming the storage node landing pad on the exposed second part of the plug comprises a chemical reaction.

In some embodiments, the plug comprises copper, and the step of forming the storage node landing pad comprises reacting germane with the second part of the plug.

In some embodiments, the step of forming the storage node landing pad comprises electroplating the second part of the plug.

In some embodiments, the second part of the plug is electroplated with copper, silver, gold or aluminum to form the storage node landing pad.

In some embodiments, the step of exposing the second part of the plug comprises oxide buffing the first dielectric to expose the plug.

In some embodiments, the oxide buffing comprises chemical mechanical polishing.

In some embodiments, the step of forming the storage node comprises: forming a storage node contact hole through the third dielectric and the second dielectric so that the storage node landing pad is exposed; forming a conductive layer on the third dielectric and in the storage node contact hole so that the conductive layer is in contact with the storage node landing pad; and patterning the conductive layer to form the storage node.

In some embodiments, the step of forming the plug comprises: forming a plug contact hole in the first dielectric to expose the source of the substrate; forming a conductive layer covering the first dielectric and in the plug contact hole so that the conductive layer is in contact with the source of the substrate; and removing the part of the conductive layer on the first dielectric to form the plug.

In some embodiments, the step of forming the bit line comprises: forming a bit line contact hole in the second dielectric to expose the drain of the substrate; forming a conductive layer on the second dielectric and in the bit line contact hole so that the conductive layer is in contact with a bit line landing pad disposed on the drain of the substrate; and patterning the conductive layer to form the bit line.

In some embodiments, the steps of forming the first dielectric, the second dielectric, and the third dielectric comprise chemical vapor deposition of borophosphorous silicate glass.

The foregoing has outlined rather broadly the features and technical advantages of the present disclosure in order that the detailed description of the disclosure that follows may be better understood. Additional features and advantages of the disclosure will be described hereinafter, and form the subject of the claims of the disclosure. It should be appreciated by those skilled in the art that the conception and specific embodiment disclosed may be readily utilized as a basis for modifying or designing other structures or processes for carrying out the same purposes of the present disclosure. It should also be realized by those skilled in the art that such equivalent constructions do not depart from the spirit and scope of the disclosure as set forth in the appended claims.

BRIEF DESCRIPTION OF THE DRAWINGS

Aspects of the present disclosure are best understood from the following detailed description when read with the accompanying figures. It should be noted that, in accordance with the standard practice in the industry, various features are not drawn to scale. In fact, the dimensions of the various features may be arbitrarily increased or reduced for clarity of discussion.

DETAILED DESCRIPTION

Figure 1:
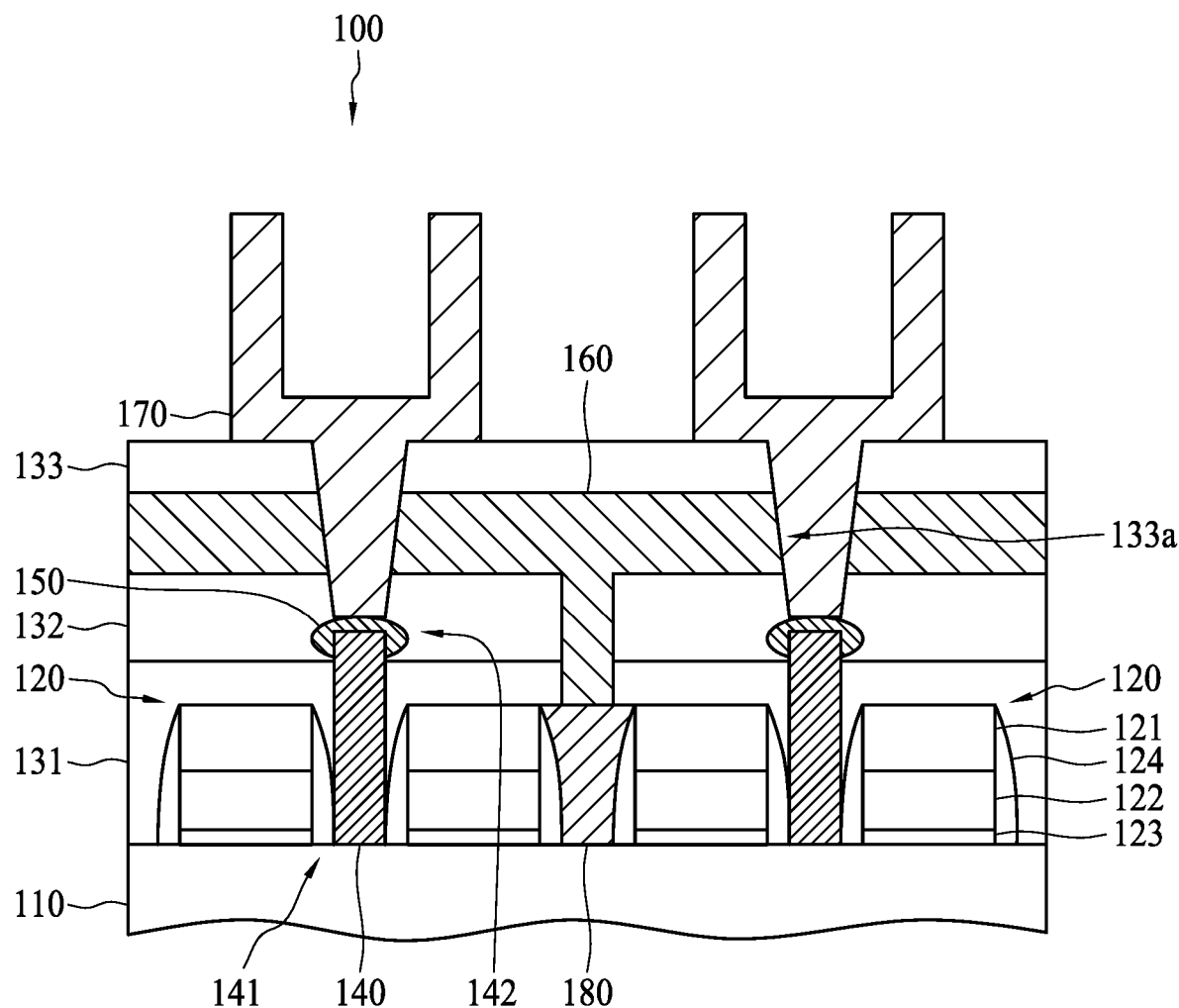
FIG. 1 is a sectional view of a semiconductor memory device in accordance with some embodiments of the present disclosure.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

FIG. 1 is a sectional view of the semiconductor memory device in accordance with some embodiments of the present disclosure. Referring to FIG. 1, the semiconductor memory device 100 provided in the present disclosure has a substrate 110 with a drain (not shown) and a source (not shown). A gate structure 120 is disposed on the substrate 110 between the drain and the source. The semiconductor memory device 100 further comprises a first inter-layer dielectric 131, a second inter-layer dielectric 132, a plug 140, a storage node landing pad 150, a bit line 160, a third inter-layer dielectric 133 and a storage node 170. In one embodiment, the gate structure 120 further has a silicide 121, a polycrystalline silicon 122, a gate oxide 123, and a spacer 124.

The first inter-layer dielectric 131 is disposed on the substrate 110 and the second inter-layer dielectric 132 is disposed on the first inter-layer dielectric 131. The plug 140 has a first part 141 in the first inter-layer dielectric 131, which is in contact with the source (not shown) of the substrate 110, and a second part 142, which is in the second inter-layer dielectric 132. The storage node landing pad 150 covers the second part 142 of the plug 140 in the second inter-layer dielectric 132. In one embodiment, the material of the plug 140 comprises copper and the storage node landing pad 150 comprises $Cu_3Ge$. The plug 140 and the storage node landing pad 150 can also be made of other materials. In yet another embodiment, the plug 140 may comprise tungsten or aluminum and the storage node landing pad 150 may comprise gold, silver or aluminum, depending on the manufacturing process, which is discussed in detail below.

The bit line 160 is disposed between the second inter-layer dielectric 132 and the third inter-layer dielectric 133 and is connected to the drain (not shown) of the substrate 110. In one embodiment, the substrate 110 may further have a bit line landing pad 180, and the bit line 160 may be connected to the drain of the substrate 110 by contacting the bit line landing pad 180.

The storage node 170 is disposed on the third inter-layer dielectric 133, contacting the storage node landing pad 150 through the second inter-layer dielectric 132 and the third inter-layer dielectric 133 and thus electrically connected to the substrate 110 in the source (not shown).

Figure 2:
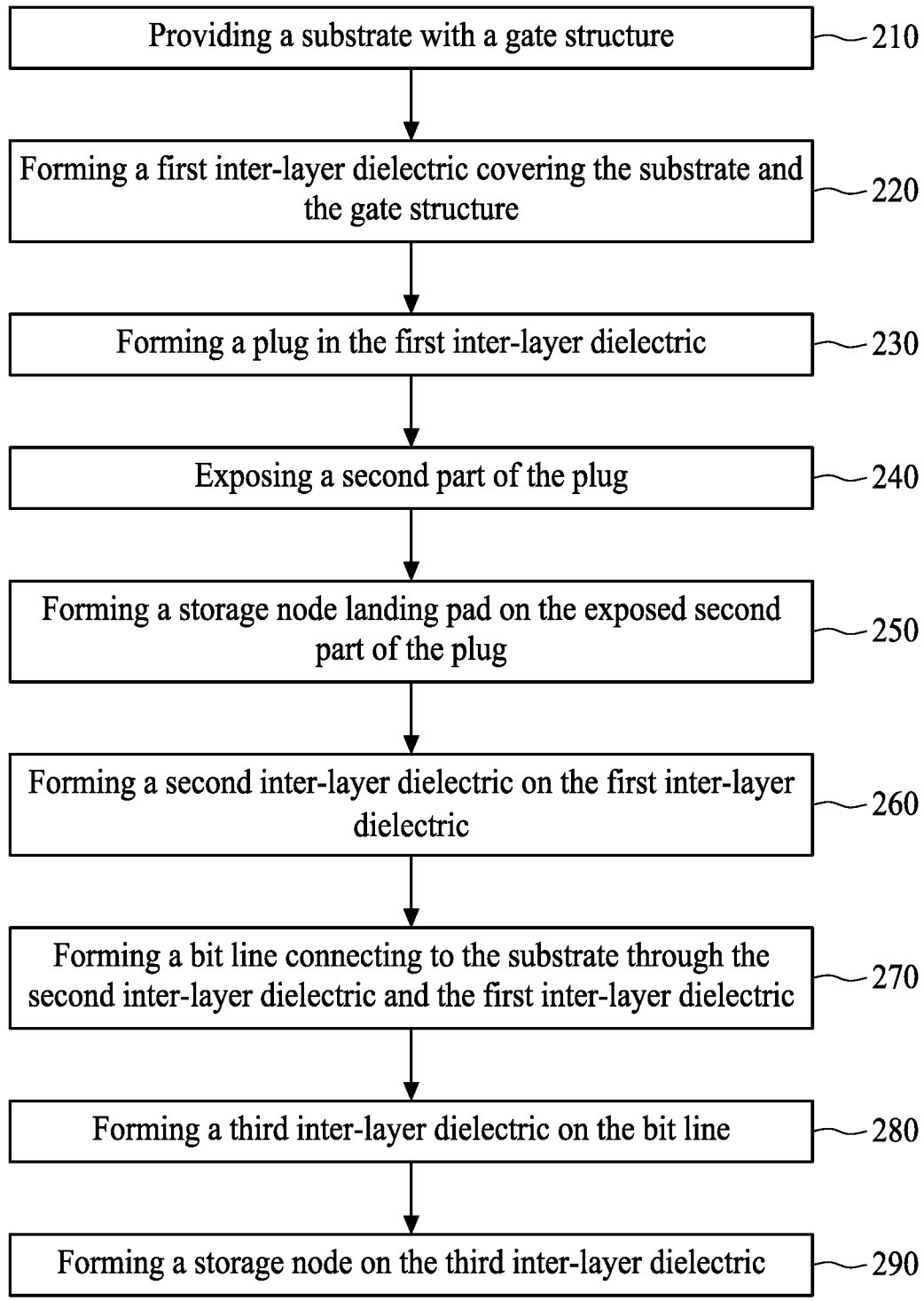
FIG. 2 is a flow diagram of a method of manufacturing the semiconductor memory device in accordance with some embodiments of the present disclosure.
Figure 3:
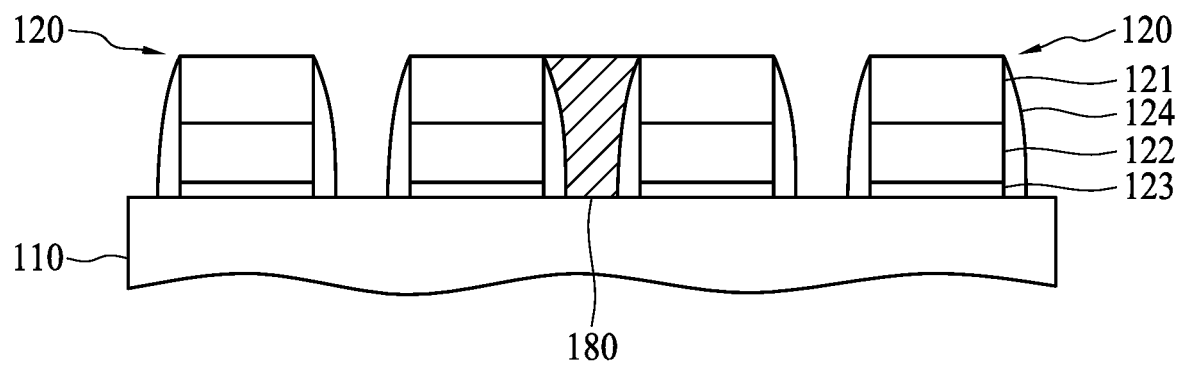
FIGS. 3 to 10 are sectional views of the results of the steps of the method of manufacturing the semiconductor memory device in accordance with some embodiments of the present disclosure.

FIG. 2 is a flow diagram of the method of manufacturing the semiconductor memory device in accordance with some embodiments of the present disclosure, and FIGS. 3 to 10 are sectional views of the results of the steps of the method of manufacturing the semiconductor memory device in accordance with some embodiments of the present disclosure. Please refer to FIG. 2 and FIG. 3 for the method of manufacturing a semiconductor memory device 200 in one embodiment of the present disclosure. First, in step 210, a substrate 110 with a drain (not shown), a source (not shown) and a gate structure 120 disposed on the substrate between the drain and the source is provided. In some embodiments, the substrate 110 may further have a bit line landing pad 180 to facilitate subsequent steps of the process.

Figure 4:
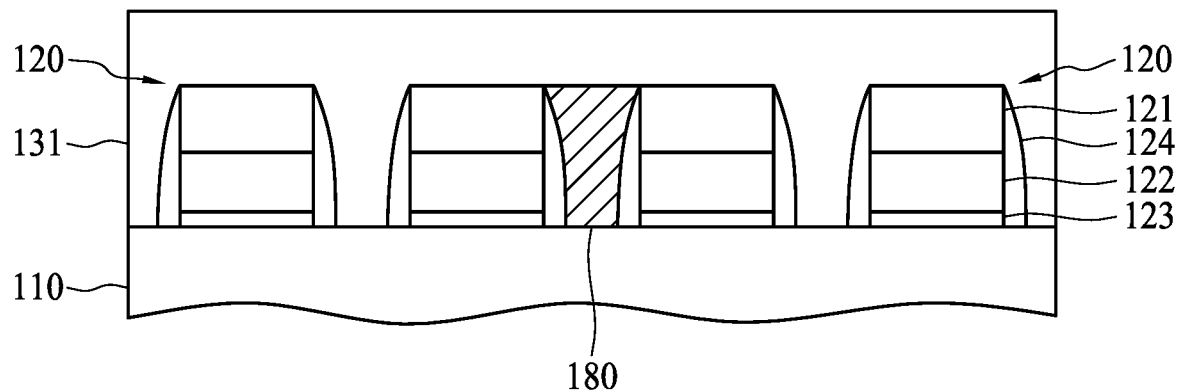

Referring to FIG. 2 and FIG. 4, in step 220, a first inter-layer dielectric 131 is formed on the substrate 110, wherein the first inter-layer dielectric 131 covers the substrate 110 and the gate structure 120. In some embodiments of the present disclosure, borophosphorous silica glass (BPSG) may be deposited on the substrate 110 with chemical vapor deposition (CVD) to form the first inter-layer dielectric 131.

Figure 5:
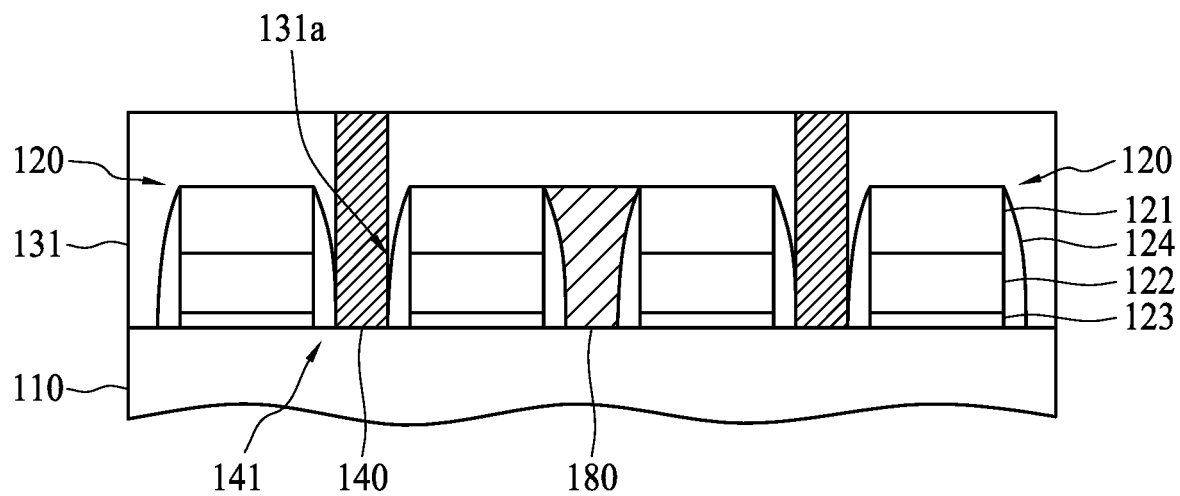

Referring to FIG. 2 and FIG. 5, in step 230, a plug 140 is formed in the first inter-layer dielectric 131. The plug 140 has a first part 141 in contact with the substrate 110 in the source (not shown). Forming the plug may be further divided into several steps. For example, in some embodiments of the present disclosure, forming the plug may comprise the step of etching the first inter-layer dielectric 131 with buffered oxide etchant (BOE) to form a plug contact hole 131a. Next, a conductive layer (not shown) is formed on the first inter-layer dielectric 131 and in the plug contact hole 131a so the conductive layer is in contact with the source of the substrate 110. In one embodiment of the present disclosure, copper is deposited on the first inter-layer dielectric 131 with CVD, and the first inter-layer dielectric 131 is then etched to remove the copper from the first inter-layer dielectric 131, so that only the copper in the plug contact hole 131a is left remaining and thus form the plug 140 contacting the source of the substrate 110. Other material can be used for the conductive layer. In yet another embodiment of the present disclosure, the conductive layer comprises tungsten, which can form the plug 140 by a process similar to the process described above.

Figure 6:
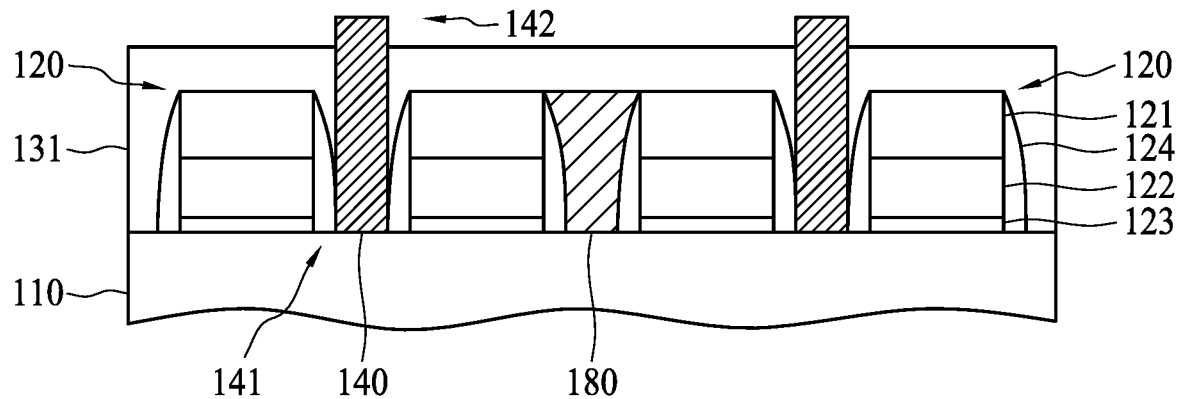

As shown in FIG. 2 and FIG. 6, in step 240, the plug 140 is exposed through the first inter-layer dielectric 131. In one embodiment of the present disclosure, a conventional technique of oxide buffing, such as chemical mechanical polishing (CMP), can be used to remove part of the first inter-layer dielectric 131 in order to expose the plug 140 and form an exposed second part 142 of the plug 140. In yet another embodiment of the present disclosure, an oxide etchant can be used to etch the first inter-layer dielectric 131 and expose the second part 142 of the plug 140.

Figure 7:
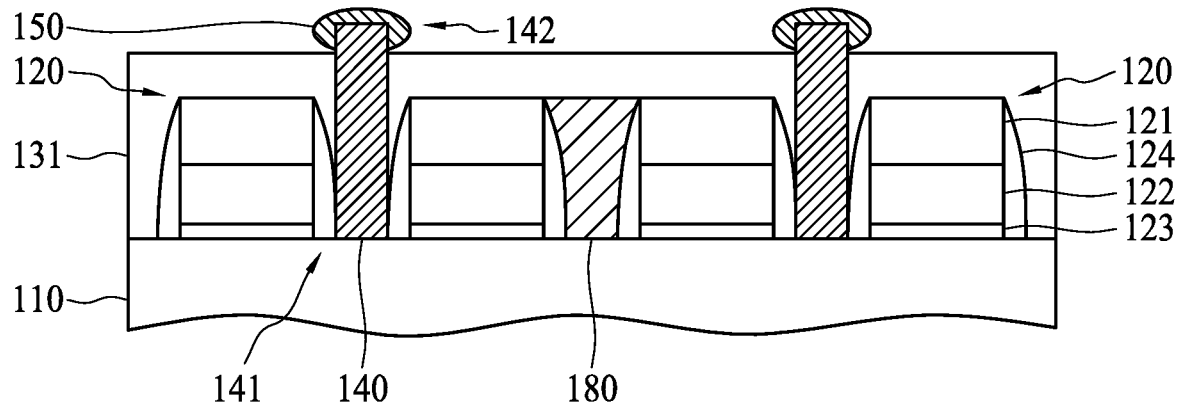

Next, as shown in FIG. 2 and FIG. 7, in step 250, a storage node landing pad 150 is formed on the second part 142 of the plug 140. In one embodiment, the plug 140 comprises copper, and the step of forming the storage node landing pad 150 may comprise applying germane ($GeH_4$) to the resultant structure. Germane reacts with the second part 142 of the plug 140 and generates a layer of $Cu_3Ge$ covering the second part 142 of the plug 140, which can be used as the storage node landing pad 150. Since germane does not react with the first inter-layer dielectric 131 (e.g., BPSG), the $Cu_3Ge$ layer can be formed selectively on the second part 142 of the plug 140. Thus, the manufacturing process can be simplified because no patterning is needed. Moreover, because of the high selectivity of the abovementioned chemical reaction, the storage node landing pad 150 is self-aligning and unwanted connections between the storage node landing pads 150 such as the stringer or bridge phenomenon due to defects in the patterning process can be avoided. Other selective processes can also be applied to form the storage node landing pad 150. In one embodiment of the present disclosure, electroplating may be used to generate the storage node landing pad 150. Since the plug 140 is highly conductive compared to the first inter-layer dielectric 131, an electroplating process can also be used to form a highly selective layer on the second part 142 of the plug 140.

Figure 8:
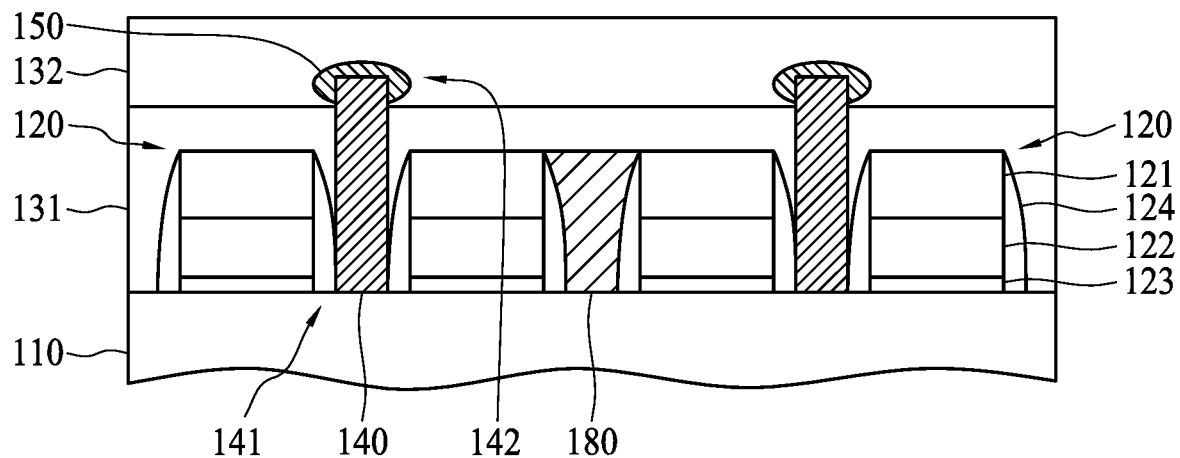

Referring to FIG. 2 and FIG. 8, in step 260, a second inter-layer dielectric 132 is formed on the first inter-layer dielectric 131, which covers the storage node landing pad 150 formed in the previous step. In one embodiment of the present disclosure, BPSG may be deposited on the first inter-layer dielectric 131 with CVD to form the second inter-layer dielectric 132.

Figure 9:
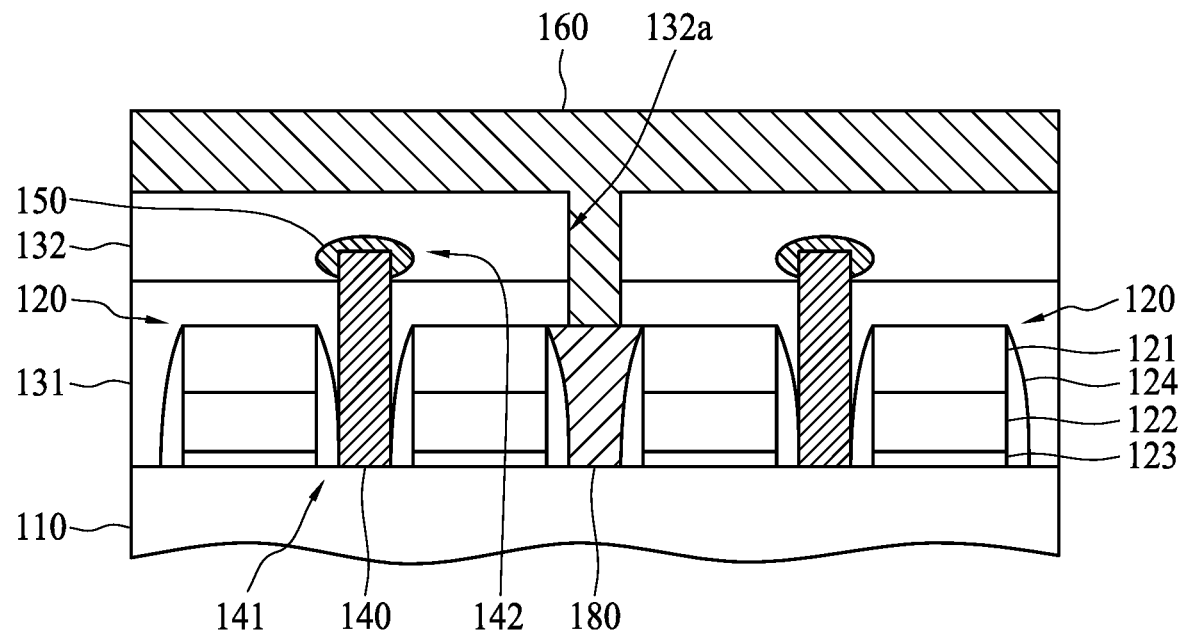

Referring to FIG. 2 and FIG. 9, in step 270, bit line 160 is formed to connect to the drain (not shown) on the substrate 110 through the first inter-layer dielectric 131 and the second inter-layer dielectric 132. In some embodiments of the present disclosure, the step of forming the bit line 160 may further comprise the following step: forming bit line contact hole 132a, which exposes the bit line landing pad 180 on the substrate 110 through the first inter-layer dielectric 131 and the second inter-layer dielectric 132; forming a conductive layer (not shown) on the second inter-layer dielectric 132 and filling the bit line contact hole 132a; and patterning the conductive layer to form the bit line 160. In one embodiment of the present disclosure, BOE can be applied to etch the second inter-layer dielectric 132 and form the bit line contact hole 132a.

Figure 10:
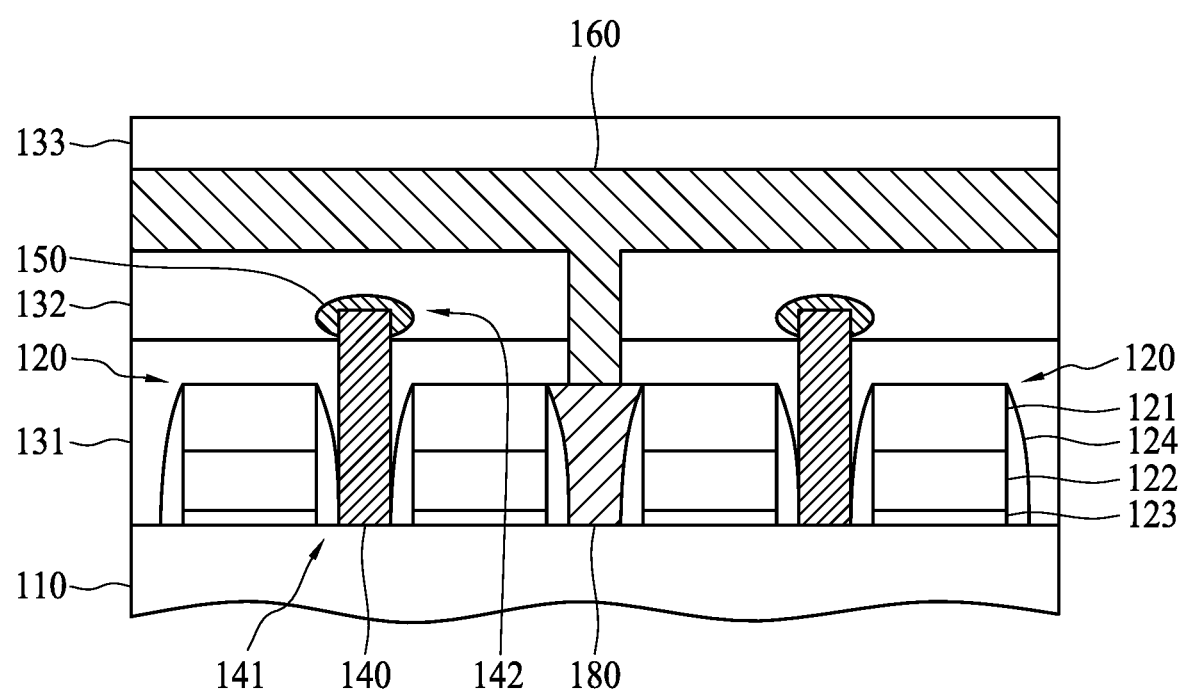

Referring to FIG. 2 and FIG. 10, in step 280, a third inter-layer dielectric 133 is formed on the bit line 160. In some embodiments of the present disclosure, the third inter-layer dielectric 133 can be formed by depositing BPSG with CVD.

Referring to FIG. 2 and FIG. 1, in step 290, a storage node 170 is formed on the third inter-layer dielectric 133. The storage node 170 contacts the storage node landing pad 150 through the third inter-layer dielectric 133 and the second inter-layer dielectric 132. In some embodiments of the present disclosure, forming the storage node 170 further comprises the step of forming storage node contact hole 133a through the first inter-layer dielectric 131 and the second inter-layer dielectric 132. A conductive layer (not shown) is then disposed on the third inter-layer dielectric 133 and fills the storage node contact hole 133a. Next, the conductive layer can be patterned with photolithography process to form the storage node 170.

In the method of manufacturing a semiconductor memory device 200 provided in the present disclosure, highly selective process such as chemical reaction using germane or metal electroplating are applied to form a storage node landing pad 150 on the plug 140. Compared to conventional patterning used in prior art to form landing pads, the method provided in the present disclosure can avoid unwanted connection between landing pads when very high precision is required, and therefore provides greater reliability compared to conventional patterning methods and thus improves the yield rate.

Moreover, compared to the method of conventional patterning used in prior art, which requires several steps in order to form contact holes of complicated shapes, the method provided in the present disclosure involves fewer steps and thus simplifies the process.

In one embodiment, the present disclosure provides a semiconductor memory device. The semiconductor memory device has a substrate with a drain and a source and a gate structure disposed on the substrate between the drain and the source. The semiconductor memory device further has a first inter-layer dielectric disposed on the substrate, covering the gate structure, a second inter-layer dielectric disposed on the first inter-layer dielectric, and a plug having a first part in the first inter-layer dielectric and a second part in the second inter-layer dielectric. The first part of the plug is in contact with the source of the substrate. The semiconductor memory device also has a storage node landing pad, a bit line, a third inter-layer dielectric, and a storage node. The storage node landing pad covers the second part of the plug and is covered by the second inter-layer dielectric. The bit line is disposed between the second inter-layer dielectric and the third inter-layer dielectric, connected to the drain of the substrate. The third inter-layer dielectric is disposed on the bit line. The storage node is disposed on the third inter-layer dielectric, contacting the storage node landing pad through the second inter-layer dielectric and the third inter-layer dielectric.

Another embodiment of the present disclosure provides a method of manufacturing a semiconductor memory device. The method begins with a step of providing a substrate with a drain, a source and a gate structure disposed on the substrate between the drain and the source. Next, a first inter-layer dielectric is formed covering the substrate and the gate structure. Next, a plug is formed in the first inter-layer dielectric, with a first part contacting the source of the substrate. In the next step, a second part of the plug is exposed through the first inter-layer dielectric, and a storage node landing pad is formed on the exposed second part of the plug. Next, a second inter-layer dielectric is formed on the first inter-layer dielectric, covering the storage node landing pad. Thereafter, a bit line is formed, connected to the substrate through the second inter-layer dielectric and the first inter-layer dielectric. Next, a third inter-layer dielectric is formed on the bit line. Finally, a storage node is formed on the third inter-layer dielectric. The storage node contacts the storage node landing pad through the third inter-layer dielectric and the second inter-layer dielectric.

In yet another embodiment of the present disclosure, a semiconductor memory device manufactured with the abovementioned method is provided.

Although the present disclosure and its advantages have been described in detail, it should be understood that various changes, substitutions and alterations can be made herein without departing from the spirit and scope of the disclosure as defined by the appended claims. For example, many of the processes discussed above can be implemented in different methodologies and replaced by other processes, or a combination thereof.

Moreover, the scope of the present application is not intended to be limited to the particular embodiments of the process, machine, manufacture, composition of matter, means, methods and steps described in the specification. As one of ordinary skill in the art will readily appreciate from the disclosure of the present disclosure, processes, machines, manufacture, compositions of matter, means, methods, or steps, presently existing or later to be developed, that perform substantially the same function or achieve substantially the same result as the corresponding embodiments described herein may be utilized according to the present disclosure. Accordingly, the appended claims are intended to include within their scope such processes, machines, manufacture, compositions of matter, means, methods and steps.

What is claimed is:

1. A semiconductor memory device, comprising:
    a substrate with a drain and a source;
    a gate structure, disposed on the substrate between the drain and the source;
    a first dielectric, disposed on the substrate, covering the gate structure;
    a second dielectric disposed on the first dielectric;
    a plug having a first part in the first dielectric and a second part in the second dielectric, wherein the first part is in contact with the source of the substrate;
    a storage node landing pad, covering the second part of the plug and covered by the second dielectric;
    a bit line disposed on the second dielectric and connected to the drain of the substrate;
    a third dielectric disposed on the bit line; and
    a storage node, disposed on the third dielectric, contacting the storage node landing pad through the second dielectric and the third dielectric.

2. The semiconductor memory device of claim 1, wherein the plug comprises copper, tungsten, or aluminum.

3. The semiconductor memory device of claim 2, wherein the plug comprises copper and the storage node landing pad comprises $Cu_3Ge$.

4. The semiconductor device of claim 1, wherein the storage node landing pad comprises copper, gold, silver or aluminum.

5. The semiconductor memory device of claim 1, further comprising a bit line landing pad on the drain of the substrate, wherein the bit line connects to the drain of the substrate by contacting the bit line landing pad.

6. The semiconductor memory device of claim 1, wherein the bit line comprises aluminum.

7. The semiconductor memory device of claim 1, wherein the first dielectric, the second dielectric and the third dielectric comprise silicon dioxide.

8. The semiconductor memory device of claim 7, wherein the first dielectric, the second dielectric, and the third dielectric comprise borophosphorous silicate glass.

9. The semiconductor memory device of claim 1, wherein the gate structure further comprises a silicide, a polycrystalline silicon, a gate oxide, and a spacer.

* * * * *